US012579882B2

(12) United States Patent
Xu et al.

(10) Patent No.:  US 12,579,882 B2
(45) Date of Patent:     Mar. 17, 2026

(54) COMMUNICATION DEVICE, VOLTAGE DETECTION METHOD, AND COMPUTER-READABLE STORAGE MEDIUM

(71) Applicant: HUAWEI TECHNOLOGIES CO., LTD., Shenzhen (CN)

(72) Inventors: Dian Xu, Shanghai (CN); Chao Lin, Shanghai (CN); Zheng Liu, Beijing (CN); Lingui Xu, Shanghai (CN); Han Li, Shanghai (CN); Quan Hu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/637,272

(22) Filed: Apr. 16, 2024

(65) Prior Publication Data

US 2024/0265799 A1     Aug. 8, 2024

Related U.S. Application Data

(63) Continuation of application No. PCT/CN2021/134641, filed on Nov. 30, 2021.

(51) Int. Cl.
*G08B 25/10*     (2006.01)
*G01R 19/00*     (2006.01)
(Continued)

(52) U.S. Cl.
CPC ......... *G08B 25/10* (2013.01); *G01R 19/0084* (2013.01); *G01R 31/3004* (2013.01); *G01R 31/36* (2013.01); *G05B 13/0255* (2013.01)

(58) Field of Classification Search
CPC ................ G08B 25/10; G01R 31/3004; G01R 19/0084; G01R 19/16542; G01R 31/36; G05B 13/0255; H04W 72/04
See application file for complete search history.

(56) References Cited

U.S. PATENT DOCUMENTS 6,157,171 A  *  12/2000  Smith .............. G01R 19/16542
                                                              320/136
6,697,953 B1*   2/2004  Collins ............. H04W 52/0267
                                                              713/320
(Continued)

FOREIGN PATENT DOCUMENTS

| CN | 1889736 A | 1/2007 |
| CN | 101728588 A | 6/2010 |
| CN | 105866688 A | 8/2016 |

*Primary Examiner* — John A Tweel, Jr.
(74) *Attorney, Agent, or Firm* — WOMBLE BOND DICKINSON (US) LLP

(57)     ABSTRACT

A communication device includes: one or more voltage conversion circuits. The one or more voltage conversion circuits are separately coupled to a power supply of the communication device. A voltage sampling circuit is coupled to the power supply, and/or the voltage sampling circuit is coupled to an output end of at least one of the one or more voltage conversion circuits. A controller is configured to: control the voltage sampling circuit to collect voltages output by the power supply or voltages output by a first voltage conversion circuit in a plurality of sending timeslots or a plurality of receiving timeslots of the communication device; and determine a real voltage of the power supply based on the voltages output by the power supply or the voltages output by the first voltage conversion circuit in the plurality of sending timeslots or the plurality of receiving timeslots of the communication device.

17 Claims, 4 Drawing Sheets

(51) Int. Cl.
    *G01R 31/30*         (2006.01)
    *G01R 31/36*         (2020.01)
    *G05B 13/02*         (2006.01)

(56)               References Cited

U.S. PATENT DOCUMENTS

| | | | |
|---|---|---|---|
| 10,645,658 B2 * | 5/2020 | Chen | H04L 67/12 |
| 10,761,118 B2 * | 9/2020 | Hou | G01R 31/3648 |
| 11,734,538 B1 * | 8/2023 | Frankel | G06K 19/0707 |
| | | | 340/572.1 |

* cited by examiner

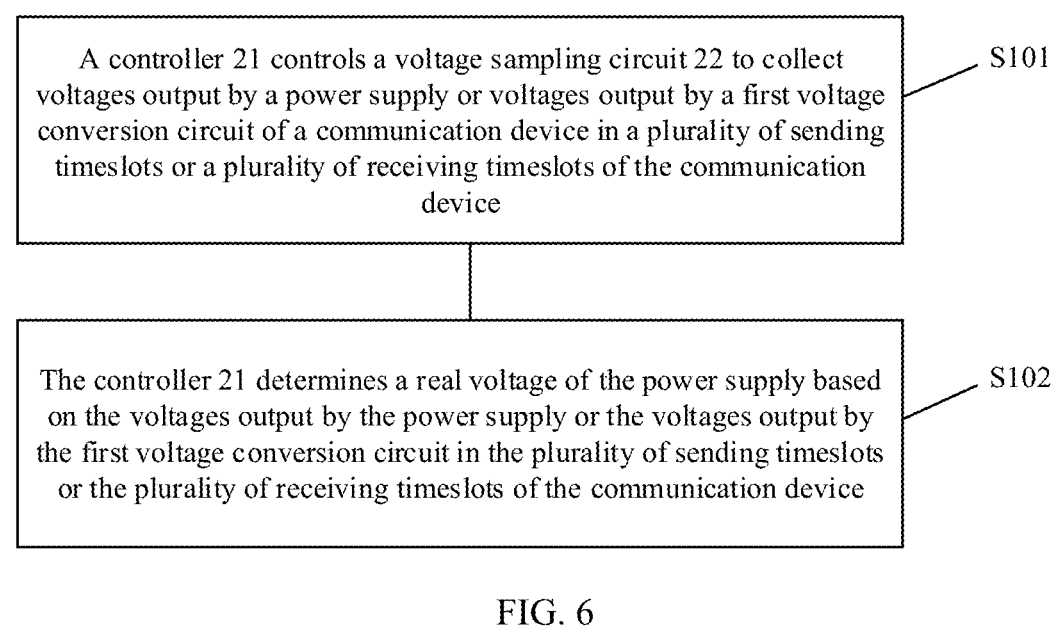

A controller 21 controls a voltage sampling circuit 22 to collect voltages output by a power supply or voltages output by a first voltage conversion circuit of a communication device in a plurality of sending timeslots or a plurality of receiving timeslots of the communication device    — S101

The controller 21 determines a real voltage of the power supply based on the voltages output by the power supply or the voltages output by the first voltage conversion circuit in the plurality of sending timeslots or the plurality of receiving timeslots of the communication device    — S102

FIG. 6

COMMUNICATION DEVICE, VOLTAGE DETECTION METHOD, AND COMPUTER-READABLE STORAGE MEDIUM

CROSS-REFERENCE TO RELATED APPLICATIONS

This application is a continuation of International Application No. PCT/CN2021/134641, filed on Nov. 30, 2021, the disclosure of which is hereby incorporated by reference in its entirety.

TECHNICAL FIELD

This application relates to the field of electronic technologies, and in particular, to a communication device, a voltage detection method, and a computer-readable storage medium.

BACKGROUND

Currently, more and more communication devices serve people's lives, for example, a narrow band Internet of Things (NBIOT) device like an unmanned water meter or gas meter, or a smoke detector, can collect data and exchange data with a base station, a server, or another electronic device. The NBIOT device is a type of cellular communication device with ultra-low power consumption, and therefore is widely used.

A power supply used by the NBIOT device generally includes a nickel-hydrogen battery, a lithium sub-battery, a lithium-manganese battery, and the like. The NBIOT device generally has a fixed life cycle, or referred to as a fixed service life. For example, the NBIOT device like the water meter or the gas meter, is required to be on standby for more than five years.

Currently, there are high specification standard requirements on an electricity quantity of power supply and reliability of the NBIOT device. Accurate detection of the electricity quantity of the power supply helps evaluate performance of the NBIOT device or maintain and manage the NBIOT device, like replacing the power supply. Generally, a power supply voltage of the NBIOT device is detected, to determine the electricity quantity of the power supply. Currently, a method for accurately detecting the power supply voltage of the NBIOT device is urgently needed.

SUMMARY

This application provides a communication device, a voltage detection method, and a computer-readable storage medium, to improve accuracy of detecting a power supply voltage of the communication device, and facilitate maintenance of the communication device.

According to a first aspect, this application provides a communication device, and the communication device may include one or more voltage conversion circuits. The one or more voltage conversion circuits are separately coupled to a power supply of the communication device, and each voltage conversion circuit is configured to: perform voltage transformation processing on a voltage provided by the power supply, and then provide a transformed voltage to at least one load. A voltage sampling circuit is coupled to the power supply, and/or the voltage sampling circuit is coupled to an output end of at least one of the one or more voltage conversion circuits. A controller is coupled to the voltage sampling circuit. The controller may be configured to: control the voltage sampling circuit to collect voltages output by the power supply or voltages output by a first voltage conversion circuit in a plurality of sending timeslots or a plurality of receiving timeslots of the communication device, where the first voltage conversion circuit is any one of the at least one voltage conversion circuit; and determine a real voltage of the power supply based on the voltages output by the power supply or the voltages output by the first voltage conversion circuit in the plurality of sending timeslots or the plurality of receiving timeslots of the communication device.

In an embodiment of this application, the communication device may be an electronic device having a communication capability, and may exchange data with a base station, a server, or another electronic device. For example, the communication device may be a narrow band Internet of Things (IoT) device, or may be an intelligent terminal like a mobile phone or a tablet computer. The communication device may send a signal to the base station, the server, or the another electronic device in a transmitting timeslot, and may receive a signal from the base station, the server, or the another electronic device in a receiving timeslot. The communication device is generally in a state like a low-power consumption standby state, a power-off state, or a power-on state in an idle timeslot. In the three timeslots, a voltage of the power supply of the communication device in the idle timeslot is the largest and a current thereof is the smallest; a voltage in the transmitting timeslot is the smallest and a current thereof is the largest; and a voltage in the receiving timeslot is greater than the voltage in the idle timeslot and is less than the voltage in the transmitting timeslot, and a current in the receiving timeslot is greater than the current in the idle timeslot and is less than the current in the transmitting timeslot. After the power supply is used for a period of time, an internal resistance of the power supply increases, and a power supply voltage detected in the idle timeslot may be a virtual voltage, that is, a real voltage status of the power supply cannot be reflected. This easily causes low voltage detection accuracy and a large error.

In the communication device provided in this embodiment of this application, the voltages output by the power supply collected by the voltage sampling circuit in the plurality of sending timeslots or the plurality of receiving timeslots may be used to determine the real voltage of the power supply, to avoid a case in which the determined real voltage of the power supply is a virtual voltage, so as to improve power supply voltage detection accuracy and reduce a detection error. In this embodiment of this application, the determined real voltage of the power supply may represent (or reflect) the real voltage of the power supply, and accuracy of detecting the real voltage of the power supply is improved. This facilitates maintenance of the communication device. The communication device may further include the voltage conversion circuit, and the voltage conversion circuit may perform transformation processing on the voltage output by the power supply and then provide a transformed voltage to the load. For ease of description, any voltage conversion circuit in the communication device is denoted as the first voltage conversion circuit. A voltage transformation parameter of the first voltage conversion circuit is pre-configured, and the voltage output by the power supply may be determined based on the voltage output by the first voltage conversion circuit and the voltage transformation parameter. The voltage output by the power supply of the communication device may fluctuate in the transmitting timeslot and the receiving timeslot. An error may be large when the real voltage of the power supply is determined based on the voltage output by the power supply collected at a single time, or the real voltage of the power supply is determined based on the voltage output by the first voltage conversion circuit collected at a single time. The voltage sampling circuit collects the voltages output by the first voltage conversion circuit or the voltages output by the power supply in the plurality of transmitting timeslots or the plurality of receiving timeslots, to determine a stable real voltage of the power supply.

In an embodiment, when determining the real voltage of the power supply based on the voltages output by the power supply or the voltages output by the first voltage conversion circuit in the plurality of sending timeslots or the plurality of receiving timeslots of the communication device, the controller may determine an average value of the voltages output by the power supply in the plurality of transmitting timeslots or the plurality of receiving timeslots as the real voltage of the power supply. Alternatively, the controller may determine the real voltage of the power supply based on a voltage transformation ratio parameter of the first voltage conversion circuit and an average value of the voltages output by the first voltage conversion circuit in the plurality of transmitting timeslots or the plurality of receiving timeslots.

In an embodiment of this application, when determining the real voltage of the power supply, the controller may use the voltage output by the power supply in each of the plurality of transmitting timeslots, and determine the average value as the real voltage of the power supply. Alternatively, the controller uses the voltage output by the power supply in each of the plurality of receiving timeslots, and determines the average value as the real voltage of the power supply. This design may determine a more stable real voltage of the power supply. In another example, when determining the real voltage of the power supply, the controller may determine a more stable real voltage of the first voltage conversion circuit based on an average value of the voltages output by the first voltage conversion circuit in all the transmitting timeslots of the plurality of transmitting timeslots. The controller may determine the real voltage of the power supply with reference to the voltage transformation ratio parameter of the first voltage conversion circuit and the real voltage of the first conversion circuit, to determine a more stable real voltage of the power supply. Alternatively, the controller may determine a more stable real voltage of the first voltage conversion circuit based on the average value of the voltages output by the first voltage conversion circuit in all the receiving timeslots of the plurality of receiving timeslots, and determine the real voltage of the power supply with reference to the voltage transformation ratio parameter of the first voltage conversion circuit, to determine a more stable real voltage of the power supply.

In an embodiment, one or more target loads exist in loads coupled to the one or more voltage conversion circuits and are configured to: transmit a wireless communication signal or receive a wireless communication signal. The target load has a capability of receiving or sending a wireless communication signal, so that the communication device can exchange data with a base station, a server, or another electronic device. The sending timeslot of the communication device may be a timeslot in which the target load transmits a wireless communication signal. The receiving timeslot of the communication device may be a timeslot in which the target load receives a wireless communication signal.

4

In an embodiment, to timely maintain the communication device, and avoid a case in which a load cannot work due to an excessively low power supply voltage, the controller may when the real voltage of the power supply is less than a preset voltage threshold of the power supply, control the target load to transmit a wireless communication signal that carries a prompt message, where the prompt message indicates that the communication device needs to be maintained; and/or when the real voltage of the power supply is less than the voltage threshold of the power supply, reduce a transmit power at which the target load transmits a wireless communication signal.

In an embodiment of this application, when the determined real voltage of the power supply is less than the preset voltage threshold of the power supply, reducing the power at which the target load transmits the signal can avoid rebooting of the communication device caused by a great fluctuation of the power supply of the communication device or the like. Alternatively, the controller controls the target load to transmit a wireless communication signal that carries a prompt message, so that the base station, the server, or the another electronic device receives the prompt message and notifies a maintenance personnel to maintain the communication device in time.

In an embodiment, the controller may further determine the average value of the voltages output by the first voltage conversion circuit in the plurality of transmitting timeslots or the plurality of receiving timeslots as a real voltage output by the first voltage conversion circuit. When the real voltage of the first voltage conversion circuit is less than a preset voltage conversion circuit voltage threshold, the controller controls the target load to transmit the wireless communication signal that carries the prompt message, and the prompt message indicates that the communication device needs to be maintained.

In an embodiment of this application, the controller may determine the real voltage of the first voltage conversion circuit, and determine, with reference to a preset voltage conversion circuit voltage threshold, whether the first voltage conversion circuit is abnormal. When the real voltage of the first voltage conversion circuit is less than the voltage conversion circuit voltage threshold corresponding to the first voltage conversion circuit, the first voltage conversion circuit may be abnormal, and a coupled load may fail to work normally due to an output voltage. The target load transmits the wireless communication signal that carries the prompt message. This helps notify a maintenance personnel to maintain the communication device in time.

In an embodiment, the communication device provided in this application further includes a switching circuit, where the switching circuit is separately coupled to the voltage sampling circuit, the power supply, and each of the at least one voltage conversion circuit. The switching circuit is configured to selectively connect the voltage sampling circuit to the power supply or the first voltage conversion circuit. In an embodiment of this application, the switching circuit may connect the voltage sampling circuit to the power supply, or connect the voltage sampling circuit to an output end of the first voltage conversion circuit. This helps the voltage sampling circuit collect the voltage output by the power supply or the voltage output by the first voltage conversion circuit, and flexibly use the voltage collected by the voltage sampling circuit to determine the real voltage of the power supply.

In an embodiment, before controlling the voltage sampling circuit to collect the voltages output by the power supply or the first voltage conversion circuit in the plurality of sending timeslots or the plurality of receiving timeslots of the communication device, the controller may further control the switching circuit to connect the voltage sampling circuit to the power supply or the first voltage conversion circuit.

In an embodiment, the communication device provided in embodiments of this application may further include an alarm circuit. The controller is coupled to the alarm circuit. When the real voltage of the power supply is less than the preset voltage threshold of the power supply, the controller may control the alarm circuit to send an alarm signal, and the alarm signal is a visual signal or an audible signal.

According to a second aspect, an embodiment of this application provides a voltage detection method, and the method may be performed by a control module, a control circuit, a processor, a controller, or the like in a communication device. The following uses the controller as an example for description. The voltage detection method may include: The controller controls a voltage sampling circuit to collect voltages output by a power supply or voltages output by a first voltage conversion circuit of the communication device in a plurality of sending timeslots or a plurality of receiving timeslots of the communication device. The communication device includes one or more voltage conversion circuits, and the one or more voltage conversion circuits are separately coupled to the power supply of the communication device. The voltage sampling circuit is coupled to the power supply, and/or the voltage sampling circuit is coupled to an output end of at least one of the one or more voltage conversion circuits. The controller determines a real voltage of the power supply based on the voltages output by the power supply or the voltages output by the first voltage conversion circuit in the plurality of sending timeslots or the plurality of receiving timeslots of the communication device.

In an embodiment, in the voltage detection method provided in embodiments of this application, in a process of determining the real voltage of the power supply based on the voltages output by the power supply or the voltages output by the first voltage conversion circuit in the plurality of sending timeslots or the plurality of receiving timeslots of the communication device, the controller may determine an average value of the voltages output by the power supply in the plurality of transmitting timeslots or the plurality of receiving timeslots as the real voltage of the power supply; or determine the real voltage of the power supply based on a voltage transformation ratio parameter of the first voltage conversion circuit and an average value of the voltages output by the first voltage conversion circuit in the plurality of transmitting timeslots or the plurality of receiving timeslots.

In an embodiment, in the voltage detection method provided in embodiments of this application, each voltage conversion circuit is configured to: perform voltage transformation processing on a voltage provided by the power supply, and then provide a transformed voltage to at least one load. One or more target loads exist in loads coupled to the one or more voltage conversion circuits and are configured to: transmit a wireless communication signal or receive a wireless communication signal.

In an embodiment, in the voltage detection method provided in embodiments of this application, the sending timeslot is a timeslot in which the target load transmits a wireless communication signal, and the receiving timeslot is a timeslot in which the target load receives a wireless communication signal.

In an embodiment, in the voltage detection method provided in embodiments of this application, after determining the real voltage of the power supply, the controller may when the real voltage of the power supply is less than a preset voltage threshold of the power supply, control the target load to transmit a wireless communication signal that carries a prompt message, where the prompt message indicates that the communication device needs to be maintained; and/or when the real voltage of the power supply is less than the voltage threshold of the power supply, reduce a transmit power at which the target load transmits a wireless communication signal.

In an embodiment, in the voltage detection method provided in embodiments of this application, after controlling the voltage sampling circuit to collect the voltages output by the power supply or the voltages output by the first voltage conversion circuit of the communication device in the plurality of sending timeslots or the plurality of receiving timeslots of the communication device, the controller may further determine the average value of the voltages output by the first voltage conversion circuit in the plurality of transmitting timeslots or the plurality of receiving timeslots as a real voltage output by the first voltage conversion circuit. When the real voltage of the first voltage conversion circuit is less than a preset voltage conversion circuit voltage threshold, the controller controls the target load to transmit the wireless communication signal that carries the prompt message, and the prompt message indicates that the communication device needs to be maintained.

In an embodiment, in the voltage detection method provided in embodiments of this application, the communication device further includes the switching circuit, configured to selectively connect the voltage sampling circuit to the power supply or the first voltage conversion circuit. Before controlling the voltage sampling circuit to collect the voltages output by the power supply or the first voltage conversion circuit in the plurality of sending timeslots or the plurality of receiving timeslots of the communication device, the controller may further control the switching circuit to connect the voltage sampling circuit to the power supply or the first voltage conversion circuit.

In an embodiment, in the voltage detection method provided in embodiments of this application, after determining the real voltage of the power supply, the controller may further control an alarm circuit of the communication device to send an alarm signal when the real voltage of the power supply is less than the preset voltage threshold of the power supply, and the alarm signal is a visual signal or an audible signal.

In an embodiment, in the voltage detection method provided in embodiments of this application, the communication device is a narrow band Internet of Things device.

According to a third aspect, this application provides a computer-readable storage medium, storing a computer program or instructions, and when the computer program or the instructions is/are executed, the method according to any design in the second aspect is performed.

According to a fourth aspect, this application provides a computer program product, where the computer program product includes computer instructions, and when the computer instructions are executed by a controller, the controller is enabled to perform the method according to any design in the second aspect.

For a technical effect that can be achieved in any possible design of the second aspect or the third aspect, refer to a technical effect that can be achieved in any possible design of the first aspect. Details are not described herein again.

BRIEF DESCRIPTION OF DRAWINGS

FIG. 6 is a schematic flowchart of a voltage detection method according to an example embodiment.

DESCRIPTION OF EMBODIMENTS

Figure 1:
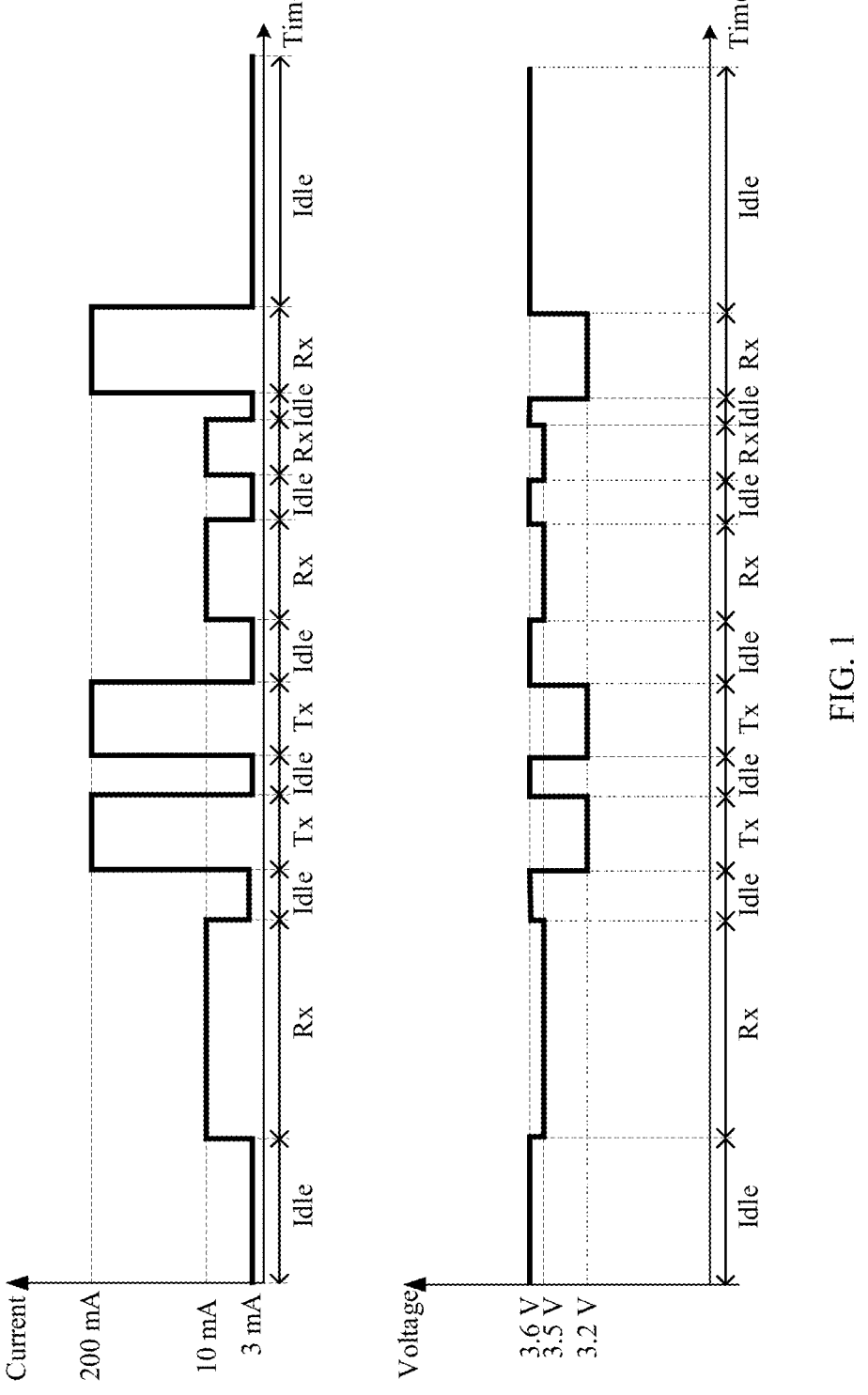
FIG. 1 is a schematic diagram of a voltage and a current status of each timeslot of an NBIOT device.

Terms used in the following embodiments are merely intended to describe specific embodiments, but are not intended to limit this application. As used in the specification and accompanying claims of this application, terms "one", "a type of", "the", "foregoing", "said", and "this" of singular forms are also intended to include an expression like "one or more", unless otherwise explicitly indicated in the context.

Reference to "an embodiment", "some embodiments", or the like described in this specification indicates that one or more embodiments of this application include a specific feature, structure, or characteristic described with reference to the embodiment. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "comprise", "have", and their variants all mean "include but not limited to", unless otherwise specifically emphasized in another manner.

To make the objectives, technical solutions, and advantages of this application clearer, the following further describes this application in detail with reference to the accompanying drawings.

An NBIOT device is a type of cellular communication device with ultra-low power consumption. The NBIOT device may directly communicate or exchange with a base station, a server, or another communication device by using an NBIOT technology. As increasing NBIOT devices are applied to people's lives, standard requirements on an electricity quantity of the power supply and reliability of the NBIOT device are increasingly high. Detection for the electricity quantity of the power supply of the NBIOT device helps evaluate whether the NBIOT device meets the standard requirements. Currently, the electricity quantity of the power supply is generally reflected by detecting a power supply voltage. Therefore, accuracy of detecting a real voltage of the power supply is improved, and an error of detecting the real voltage of the power supply is reduced. This helps determine the electricity quantity of the power supply. In a communication device that uses another communication technology for communication, there is also a same requirement, namely, a requirement to accurately determine the real voltage of the power supply of the communication device.

In embodiments of this application, the communication device may be a device that has a capability of exchanging with a base station, a server, or another electronic device. For example, the communication device may be an electronic device like a base station or a terminal, namely, an electronic device having a capability of receiving a wireless communication signal. The communication device may also have a capability of receiving a wireless communication signal. A communication protocol used by the communication device to receive and/or send a wireless communication signal is not specifically limited in embodiments of this application. The communication device may receive/send a wireless communication signal by using an existing communication protocol, or may receive/send a wireless communication signal by using a future communication protocol. The following describes an application scenario by using an example in which the communication device uses an NBIOT communication protocol, that is, the communication device may be an NBIOT device.

A status of the NBIOT device may be broadly divided into two types: an idle state or a connected state. When the NBIOT device is not connected to the base station, the NBIOT device may be referred to as being in the idle state. For example, after the NBIOT device is powered off, or the NBIOT device is in a low-power consumption standby state, the NBIOT device may be referred to as being in the idle state. In this application, a time period in the idle state is referred to as an idle (Idle) timeslot. When the NBIOT device is connected to the base station, the NBIOT device may be referred to as being in the connected state. For example, when the NBIOT device sends data to the base station or receives data sent by the base station, the NBIOT device may be referred to as being in the connected state. In this application, a time period in which the NBIOT device sends data to the base station is referred to as a transmitting (Tx) timeslot, and a time period in which the NBIOT device receives data sent by the base station is referred to as a receiving (Rx) timeslot.

A running time axis of the NBIOT device generally includes time information corresponding to powering on or low-power consumption standby, network searching, registration, data transmission, powering off or low-power consumption standby, and the like. Powering on, powering off, or power consumption standby usually occurs in the idle timeslot. Network searching usually occurs in the Rx timeslot. Registration usually occurs in the Tx timeslot. Data transmission is usually data exchange between the NBIOT device and the base station. Therefore, data transmission may occur in the Rx timeslot or the Tx timeslot.

FIG. 1 shows current and voltage conditions of a power supply of an NBIOT device in different timeslots. In an idle timeslot, a current of the power supply is minimum and a voltage of the power supply is maximum. In a Tx timeslot, a current of the power supply is maximum and a voltage of the power supply is minimum. In an Rx timeslot, a magnitude of a current of the power supply is between that of the current of the power supply in the idle timeslot and that of the current of the power supply in the Tx timeslot, and a magnitude of a voltage of the power supply is between that of the voltage of the power supply in the idle timeslot and that of the voltage of the power supply in the Tx timeslot.

To reduce an error of detecting the voltage of the power supply and improve accuracy of detecting the voltage of the power supply, this application provides a communication device, to effectively reduce the error of detecting the voltage of the power supply and improve the accuracy of detecting the voltage of the power supply. Generally, a status of the communication device may include an idle state and a connected state, that is, the communication device generally has the foregoing idle timeslot, Tx timeslot, and Rx timeslot. The communication device may be a narrow band Internet of Things device or an intelligent terminal like a mobile phone or a tablet computer, and can exchange data with a base station or a server.

Figure 2:
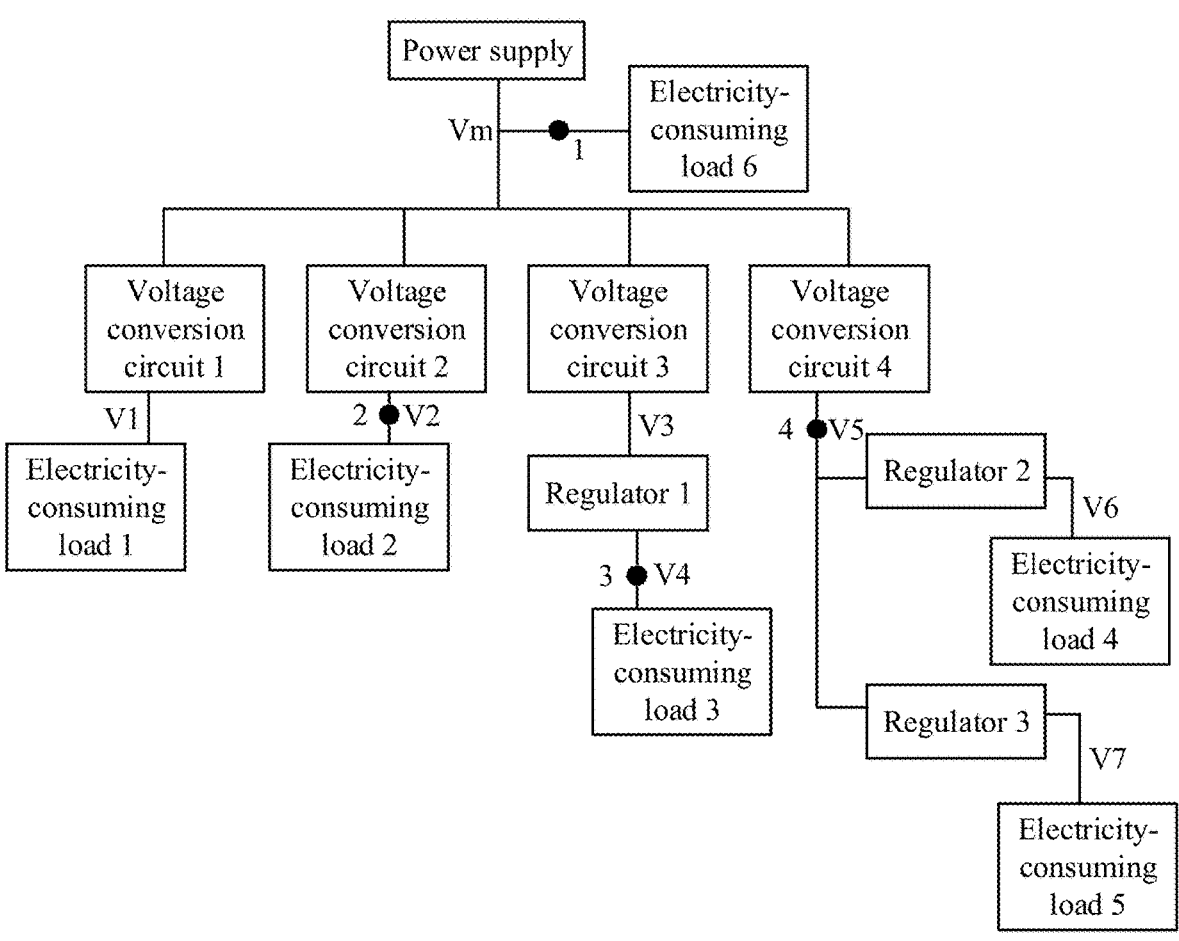
FIG. 2 is a schematic diagram of a coupling status of a power supply and a voltage conversion circuit of a communication device.

As shown in FIG. 2, the communication device provided in this application may include m voltage conversion circuits, where m may be a positive integer greater than or equal to 1, and each voltage conversion circuit may be coupled to a power supply of the communication device. The power supply of the communication device may be a power supply preset in the communication device, or may be a non-preset power supply, and may be coupled to the communication device to supply power to the communication device. The power supply of the communication device may include one or more batteries. Electric energy of each battery may be provided, through an output end of the power supply, to a voltage conversion circuit or a load that is in the communication device and that is coupled to the power supply.

In the m voltage conversion circuits, each voltage conversion circuit may alternatively be coupled to a load, and after voltage transformation processing is performed on a voltage provided by the power supply, a voltage is provided to the coupled load. In an embodiment of this application, the load coupled to the power supply or the load coupled to the voltage conversion circuit may be an electricity-consuming load inside the communication device, or may be an electricity-consuming load outside the communication device.

In an embodiment, the communication device may include n electricity-consuming loads, where n may be a positive integer greater than or equal to 1, and n may be greater than or equal to m. For example, FIG. 2 shows six electricity-consuming loads, including an electricity-consuming load 1, an electricity-consuming load 2, an electricity-consuming load 3, an electricity-consuming load 4, an electricity-consuming load 5, and an electricity-consuming load 6. It should be noted that a quantity of electricity-consuming loads in FIG. 2 is merely used for an example, and is not used as a specific limitation on the quantity of electricity-consuming loads.

The electricity-consuming load is usually an electricity-consuming module or an electricity-consuming component, for example, a clock circuit, a radio frequency transceiver, a display component, or a power amplification circuit. This is not limited herein in this application. The clock circuit may have (or implement) a clock synchronization function. The radio frequency transceiver can receive or send a radio frequency signal. The display component can display information, such as text, digits, characters, symbols, or graphics. The power amplification circuit can perform power amplification processing on a signal.

In some examples, the electricity-consuming load may be directly coupled to the power supply, that is, the power supply supplies power to the directly coupled electricity-consuming load. For example, the power supply may directly supply power to the electricity-consuming load like the display component, or the power amplification circuit.

In some other examples, the electricity-consuming load may be coupled to the power supply through one or more voltage conversion circuits. In other words, the electricity-consuming load may be coupled to the power supply through a corresponding voltage conversion circuit (the one or more voltage conversion circuits). That is, the power supply may be coupled to the electricity-consuming load through the voltage conversion circuit. The voltage conversion circuit corresponding to the electricity-consuming load may be directly coupled to the electricity-consuming load, or coupled to the electricity-consuming load through a regulator. The regulator may be a low dropout regulator (LDO). It can be learned that the power supply may supply power to the electricity-consuming load like the clock circuit or the radio frequency transceiver by using the voltage conversion circuit and/or the regulator, that is, the power supply may supply power to the electricity-consuming load through the voltage conversion circuit and/or the regulator. In some examples, the voltage conversion circuit may include a transformer, for example, a direct current-to-direct current transformer.

The voltage conversion circuit may have a voltage transformation processing function. For example, the voltage conversion circuit may have a step-up processing function or a step-down processing function. The voltage conversion circuit may perform step-down processing on a voltage provided by the power supply. For ease of description, the electricity-consuming load coupled to the power supply through the voltage conversion circuit and/or the regulator is denoted as an electricity-consuming load N. An input end of the voltage conversion circuit coupled to the electricity-consuming load N may be connected to the power supply, and an output end of the voltage conversion circuit coupled to the electricity-consuming load N may be connected to the electricity-consuming load N. The voltage conversion circuit coupled to the electricity-consuming load N may provide a step-down voltage for the electricity-consuming load N. In some scenarios, the electricity-consuming load N may be coupled to the voltage conversion circuit through the regulator. The voltage conversion circuit coupled to the electricity-consuming load N may output the step-down voltage to the regulator. The regulator has a voltage regulation function, and may provide a regulated voltage for the electricity-consuming load N. Generally, the step-down voltage provided by the voltage conversion circuit coupled to the electricity-consuming load N for the electricity-consuming load N may be a working voltage of the electricity-consuming load N, that is, the voltage conversion circuit coupled to the electricity-consuming load N may supply power to the electricity-consuming load N, to ensure working of the electricity-consuming load N.

In the communication device, one voltage conversion circuit may be coupled to one or more electricity-consuming loads. A quantity of electricity-consuming loads coupled to each voltage conversion circuit may be different.

In an example, a part or all of the voltage conversion circuits in the communication device may be separately coupled to one electricity-consuming load. As shown in FIG. 2, a part of voltage conversion circuits in the communication device may be separately coupled to one electricity-consuming load. The electricity-consuming load 1 is coupled to the power supply through a voltage conversion circuit 1, and the electricity-consuming load 2 is coupled to the power supply through a voltage conversion circuit 2.

In some scenarios, a working voltage VO of the electricity-consuming load 1 may be different from a working voltage VP of the electricity-consuming load 2, and both the voltage conversion circuit 2 and the voltage conversion circuit 1 have a function of performing step-down processing on a voltage provided by the power supply. The voltage conversion circuit 1 may perform step-down processing on the voltage provided by the power supply, and provide the voltage VO for the electricity-consuming load 1. The voltage conversion circuit 2 may perform step-down processing on the voltage provided by the power supply, and provide the voltage VP for the electricity-consuming load 2. It can be learned that a plurality of voltage conversion circuits in the communication device may have different step-down capabilities, namely, different voltage transformation ratio parameters.

It can be learned that in this embodiment of this application, a voltage transformation ratio parameter of a first voltage conversion circuit (any one of the m voltage conversion circuits) may represent a ratio of a voltage (or a voltage range) received by the first conversion circuit to a voltage (or a voltage range) output by the first conversion circuit.

Still as shown in FIG. 2, another part of voltage conversion circuits in the communication device may be separately coupled to a plurality of electricity-consuming loads. That is, the plurality of electricity-consuming loads may be coupled to a same voltage conversion circuit. The same voltage conversion circuit may supply power to the plurality of electricity-consuming loads. For example, the electricity-consuming load 4 is coupled to the power supply through a voltage conversion circuit 4, and the electricity-consuming load 5 may also be coupled to the power supply through the voltage conversion circuit 4. The voltage conversion circuit 4 may simultaneously supply power to the electricity-consuming load 4 and the electricity-consuming load 5, to provide a same supply voltage.

Figure 3:
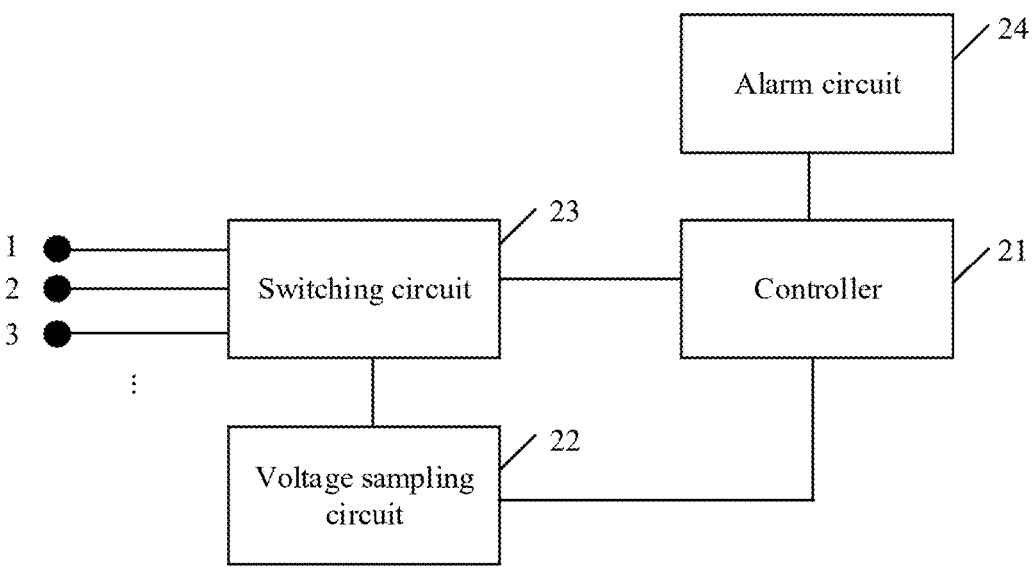
FIG. 3 is a schematic diagram of a structure of a communication device according to an example embodiment.

As shown in FIG. 3, the communication device may further include a controller 21 and a voltage sampling circuit 22. The controller 21 may also be considered as an electricity-consuming load in the communication device. In some examples, the controller 21 may control or manage another electricity-consuming load. For example, the display component may display, under control of the controller 21, a voltage of the power supply or an electricity quantity of the power supply. The voltage sampling circuit 22 has a function of collecting (or sampling) a voltage. The voltage sampling circuit 22 may collect, under control of the controller 21, a voltage output by the power supply or a voltage output by the first voltage conversion circuit (any voltage conversion circuit in the communication device). The voltage sampling circuit 22 may send the collected voltage to the controller 21. The controller 21 may control the voltage sampling circuit 22 to collect voltage values of an output end of the power supply or an output end of the first voltage conversion circuit in a plurality of transmitting timeslots or a plurality of receiving timeslots.

In an embodiment of this application, the voltage sampling circuit 22 may collect the voltage output by the power supply by collecting a voltage of a detection point corresponding to the power supply. The voltage of the detection point corresponding to the power supply can reflect the voltage output by the power supply (output voltage of the power supply). A location of the detection point corresponding to the power supply may be the output end of the power supply, or may be an input end of an electricity-consuming load (or a voltage conversion circuit) directly coupled to the power supply, or may be set at any location between an input end of the electricity-consuming load (or the voltage conversion circuit) directly coupled to the power supply and the output end of the power supply.

The voltage sampling circuit 22 may collect the voltage output by the first voltage conversion circuit by collecting a voltage of a detection point corresponding to the first voltage conversion circuit. A voltage of the detection point corresponding to the first voltage conversion circuit may reflect the voltage output by the first voltage conversion circuit (output voltage of the first voltage conversion circuit). A location of the detection point corresponding to the first voltage conversion circuit may be an output end of the first voltage conversion circuit, or may be an input end of an electricity-consuming load (or a regulator) directly coupled to the first voltage conversion circuit, or may be set at any location between the input end of the electricity-consuming load (or the regulator) directly coupled to the first voltage conversion circuit and the output end of the first voltage conversion circuit.

As shown in FIG. 2, a black spot 1 may represent the detection point corresponding to the power supply, and is set between the input end of the electricity-consuming load (for example, the electricity-consuming load 6) directly coupled to the power supply and the output end of the power supply. A black spot 2 represents a detection point corresponding to the voltage conversion circuit 2, and may be set between an output end of the voltage conversion circuit 2 and an input end of the electricity-consuming load 2. A black dot 3 represents a detection point corresponding to a voltage conversion circuit 3, and may be set between an output end of the voltage conversion circuit 3 and an input end of a regulator 1. A black dot 4 represents a detection point corresponding to a voltage conversion circuit 4, and may be set between an output end of the voltage conversion circuit 4 and an input end of a regulator 2 (which is also an input end of a regulator 3).

In an embodiment of this application, the controller 21 may control the voltage sampling circuit 22 to collect a voltage (voltage value) of any detection point (to-be-detected point) in each of a plurality of Tx timeslots of the communication device. Alternatively, the controller 21 may control the voltage sampling circuit 22 to collect a voltage (voltage value) of any detection point (to-be-detected point) in each of a plurality of Rx timeslots of the communication device.

In an embodiment, the to-be-detected point may be a detection point corresponding to the power supply. The voltage sampling circuit 22 may collect, under control of the controller 21, voltages of detection points corresponding to the power supply in the plurality of Tx timeslots or the plurality of Rx timeslots. The voltage of the detection point corresponding to the power supply collected by the voltage sampling circuit 22 may indicate a real voltage of the power supply. The controller 21 may determine the real voltage of the power supply based on the voltages output by the power supply in the plurality of Tx timeslots or the plurality of Rx timeslots of the communication device. The controller 21 may obtain the voltage value of the detection point corresponding to the power supply in each of the plurality of Tx timeslots, and determine the real voltage of the power supply based on a plurality of obtained voltage values. For example, the controller 21 determines an average value of the plurality of obtained voltage values as the real voltage of the power supply, determines a weighted average value of the plurality of obtained voltage values as the real voltage of the power supply, or determines a median of the plurality of obtained voltage values as the real voltage of the power supply.

Alternatively, the controller 21 may obtain the voltage value of the detection point corresponding to the power supply in each of the plurality of Rx timeslots, and determine the real voltage of the power supply based on a plurality of obtained voltage values. For example, the controller 21 determines an average value of the plurality of obtained voltage values as the real voltage of the power supply, determines a weighted average value of the plurality of obtained voltage values as the real voltage of the power supply, or determines a median of the plurality of obtained voltage values as the real voltage of the power supply.

Generally, the controller 21 may control the power amplification circuit and the radio frequency transceiver to compensate the voltage of the power supply based on a transmit power and a voltage compensation curve before the power amplification circuit and the radio frequency transceiver send a signal to the base station in the Tx timeslot of the communication device. The voltage of the power supply is compensated, so that the power amplification circuit and the radio frequency transceiver can send a signal to the base station based on an expected transmit power. In the idle timeslot, the voltage of the detection point corresponding to the power supply changes stably, and therefore a detection result is also stable. However, after the power supply is used for a specific period of time, an internal resistance of the power supply increases. The power supply voltage measured in the idle timeslot is a "virtual voltage". A power supply voltage detection error is likely to be large, and consequently, the power supply voltage is incorrectly compensated before the signal is transmitted to the base station. If a high-power signal is transmitted at this time, voltage jitter easily occurs, and the communication device may reboot (reboot), and re-perform operations such as network access registration and connection with the base station. Then, after establishing a connection to the base station, the communication device continues to transmit a high-power signal. This may further cause processes such as rebooting, network access registration, connection with the base station, and a high-power signal re-transmitting, until the power supply is exhausted and the communication device is fully disconnected from the base station. Sometimes, there may even be no time for the communication device to notify the base station (or the background) to update the power supply.

Some electricity-consuming loads in the communication device are in a working state in the idle timeslot, the Tx timeslot, and the Rx timeslot of the communication device, for example, the clock circuit. Other electricity-consuming loads do not work in the idle timeslot, that is, do not consume electricity, for example, the power amplification circuit and the radio frequency transceiver. For the power supply in the communication device, in the idle timeslot, a load status of the power supply is lightly loaded. In the Tx timeslot and Rx timeslot, a load status of the power supply is heavily loaded.

Still as shown in FIG. 1, in a Tx timeslot or an Rx timeslot, when the power supply is heavily loaded, a current at the power supply is large, that is, a current at a detection point corresponding to the power supply is large. In the Tx or Rx timeslot, voltage values at a plurality of moments of the detection point corresponding to the power supply are collected, to reflect a real voltage status of the power supply, that is, the real voltage of the power supply is not a "virtual voltage". Compared with the power supply voltage detected in the idle timeslot, the voltage of the detection point that corresponds to the power supply and that is collected by the communication device in the Tx timeslot or the Rx timeslot may reflect the real voltage of the power supply, namely, a real status close to the power supply voltage, to avoid that the detected power supply voltage is a "virtual voltage".

The controller 21 may control the voltage sampling circuit 22 to collect, only in the plurality of Tx timeslots of the communication device, voltages of the detection point corresponding to the power supply, to improve accuracy of detecting the power supply voltage. This also helps the communication device send a signal to the base station at the expected transmit power, so that a case of voltage jitter can be avoided, and a problem that the communication device repeatedly reboots until the power supply is exhausted and the communication device is fully disconnected from the base station may be avoided. The power supply voltage detected by the voltage sampling circuit 22 in the Tx timeslot of the communication device can better reflect a real status of the power supply voltage in the Tx timeslot, voltage accuracy is high, and repeated rebooting caused by voltage jitter may be avoided.

In another embodiment, the to-be-detected point may be a detection point corresponding to the first voltage conversion circuit (any one of the m voltage conversion circuits). The controller 21 may control, in the Tx timeslot or the Rx timeslot of the communication device, the voltage sampling circuit 22 to collect voltages of the detection point corresponding to the first voltage conversion circuit in the plurality of Tx timeslots or the plurality of Rx timeslots, to determine a real voltage of the first voltage conversion circuit. This helps determine whether the first voltage conversion circuit may normally supply power to an electricity-consuming load coupled to the first voltage conversion circuit, to ensure normal working of the electricity-consuming load.

In an example, the controller 21 may obtain the voltage value of the detection point corresponding to the first voltage conversion circuit in each of the plurality of Tx timeslots, and determine the real voltage of the first voltage conversion circuit based on a plurality of obtained voltage values. For example, the controller 21 determines an average value of the plurality of obtained voltage values as the real voltage of the first voltage conversion circuit, determines a weighted average value of the plurality of obtained voltage values as the real voltage of the first voltage conversion circuit, or determines a median of the plurality of obtained voltage values as the real voltage of the first voltage conversion circuit.

In another example, the controller 21 may obtain the voltage value of the detection point corresponding to the first voltage conversion circuit in each of the plurality of Rx timeslots, and determine the real voltage of the first voltage conversion circuit based on a plurality of obtained voltage values. For example, the controller 21 determines an average value of the plurality of obtained voltage values as the real voltage of the first voltage conversion circuit, determines a weighted average value of the plurality of obtained voltage values as the real voltage of the first voltage conversion circuit, or determines a median of the plurality of obtained voltage values as the real voltage of the first voltage conversion circuit.

When the real voltage of the first voltage conversion circuit determined by the controller 21 is less than a preset voltage conversion circuit voltage threshold, it reflects that the voltage provided by the first voltage conversion circuit for the electricity-consuming load coupled to the first voltage conversion circuit is less than a working voltage of the electricity-consuming load. When the real voltage of the first voltage conversion circuit is greater than or equal to the preset voltage conversion circuit voltage threshold, the voltage provided by the first voltage conversion circuit for the electricity-consuming load coupled to the first voltage conversion circuit is greater than or equal to the working voltage of the electricity-consuming load.

In an embodiment, the controller 21 may determine the real voltage of the power supply based on the real voltage of the first voltage conversion circuit. The controller 21 may determine the real voltage of the power supply with reference to the voltage transformation ratio parameter of the first conversion circuit and the real voltage of the first voltage conversion circuit. For example, the first conversion circuit performs step-down processing on a voltage output by the power supply, and a voltage transformation ratio parameter a may represent a ratio of a voltage (or a voltage range) received by the first conversion circuit to a voltage (or a voltage range) output by the first conversion circuit. The controller 21 may determine (calculate, estimate, or speculate) the voltage received by the first conversion circuit based on the voltage output by the first conversion circuit and the voltage transformation ratio parameter. It may be learned that the controller 21 may determine the real voltage of the power supply with reference to the real voltage of the first voltage conversion circuit and the voltage transformation ratio parameter of the first conversion circuit.

It may be learned from the foregoing descriptions that the real voltage of the first conversion circuit determined by the controller 21 may be used to determine whether the first conversion circuit can ensure normal working of the coupled load. The real voltage of the first conversion circuit may also be used to determine the real voltage of the power supply, and determine whether the power supply can ensure normal working of the communication device.

Based on the descriptions of the coupling relationship between the electricity-consuming load and the power supply in the foregoing embodiments, it may be learned that in some scenarios, the power supply of the communication device may be directly coupled to a part of electricity-consuming loads, and the power supply may be coupled to another part of electricity-consuming loads through a voltage conversion circuit and/or a regulator. For ease of making the coupling relationship between the electricity-consuming load and the power supply in the communication device and a function of the detection point corresponding to the voltage conversion circuit clear, in an example, an NBIOT device may include a plurality of electricity-consuming loads and the power supply. A coupling relationship between each electricity-consuming load and the power supply is as follows. As shown in FIG. 2, for example, the electricity-consuming load 1 may be coupled to the power supply through the corresponding voltage conversion circuit 1. The voltage conversion circuit 1 may perform step-down processing on a power supply voltage Vm, and provide a voltage V1 obtained through step-down processing for the electricity-consuming load 1. A voltage V2 is a working voltage of the electricity-consuming load 1. Similarly, the electricity-consuming load 2 may be coupled to the power supply through the corresponding voltage conversion circuit 2. The voltage conversion circuit 2 may perform step-down processing on the power supply voltage Vm, and provide a voltage V2 obtained through step-down processing for the electricity-consuming load 2. A voltage V2 is a working voltage of the electricity-consuming load 2.

The electricity-consuming load 3 may be coupled to the power supply through a voltage conversion circuit and a regulator, for example, the voltage conversion circuit 3 and the regulator 1. The voltage conversion circuit 3 and the regulator 1 may be sequentially connected in series between the power supply and the electricity-consuming load 3. The voltage conversion circuit 3 may perform step-down processing on the power supply voltage Vm, and provide a voltage V3 obtained through step-down processing for the regulator 1. The regulator 1 performs step-down processing on the voltage V3 provided by the voltage conversion circuit 3, and provides a voltage V4 obtained through step-down processing for the electricity-consuming load 3. It may be learned that the regulator 1 has a function of regulating a voltage processed by the voltage conversion circuit 3.

Similarly, the electricity-consuming load 4 may also be coupled to the power supply through a voltage conversion circuit and a regulator, for example, through the voltage conversion circuit 4 and the regulator 2. The voltage conversion circuit 4 and the regulator 2 may be sequentially connected in series between the power supply and the electricity-consuming load 4. The voltage conversion circuit 4 may perform step-down processing on the power supply voltage Vm, and provide a voltage V5 obtained through step-down processing for the regulator 2. The regulator 2 performs voltage regulation processing on the voltage V5 provided by the voltage conversion circuit 4, and provides a voltage V6 obtained through voltage regulation processing for the electricity-consuming load 4.

The electricity-consuming load 5 may also be coupled to the power supply through a voltage conversion circuit and the regulator, for example, through the voltage conversion circuit 4 and the regulator 3. The voltage conversion circuit 4 and the regulator 3 may be sequentially connected in series between the power supply and the electricity-consuming load 5. The voltage conversion circuit 4 may perform step-down processing on the power supply voltage Vm, and provide a voltage V5 obtained through step-down processing for the regulator 3. The regulator 3 performs step-down processing on the voltage V5 provided by the voltage conversion circuit 4, and provides a voltage V7 obtained through step-down processing for the electricity-consuming load 5.

The voltage conversion circuit 4 may perform step-down processing on the supply voltage Vm of the power supply, and synchronously provide the V5 obtained through step-down processing for the regulator 2 and the regulator 3. It may be learned that a same voltage conversion circuit may supply power to a plurality of electricity-consuming loads.

The electricity-consuming load 6 may be directly coupled to the power supply, and a working voltage of the electricity-consuming load 6 (may be a voltage at which the electricity-consuming load 6 is in a working state) may be the power supply voltage Vm.

Based on the foregoing descriptions of coupling manners of the electricity-consuming loads and the power supply, in an actual application scenario, the communication device may include but is not limited to the electricity-consuming load coupled to the power supply in any one of the manners. The electricity-consuming load may alternatively be coupled to the power supply in another manner.

To evaluate whether the electricity-consuming load in the communication device can run normally and improve accuracy of detecting the power supply voltage, the communication device may include a plurality of detection points. The plurality of detection points may include the detection point corresponding to the power supply and the detection point corresponding to the first voltage conversion circuit (any voltage conversion circuit in the communication device). The controller 21 may control the voltage sampling circuit 22 to collect voltages of the to-be-detected point in the plurality of Tx timeslots or the plurality of Rx timeslots, and determine a real voltage of the to-be-detected point based on the voltages of the to-be-detected point in the plurality of Tx timeslots or the plurality of Rx timeslots, to detect the real voltage of the power supply and/or detect the real voltage of the first voltage conversion circuit. The to-be-detected point may be any one of the plurality of detection points.

Still as shown in FIG. 2, the detection point corresponding to the power supply may be set between the power supply and the electricity-consuming load directly coupled to the power supply, or set at any point of a connection line of the power supply and the electricity-consuming load (or the voltage conversion circuit) directly coupled to the power supply. For example, a detection point 1 may be set between the power supply and the electricity-consuming load 6. A voltage of the detection point 1 may represent (or reflect) the power supply voltage. If the controller 21 determines that a real voltage of the detection point 1 is less than the voltage threshold of the power supply, an electricity quantity of the power supply is insufficient. On the contrary, if the controller 21 determines that the real voltage of the detection point 1 is greater than or equal to the voltage threshold of the power supply, the electricity quantity of the power supply is sufficient. In some possible scenarios, the electricity-consuming load 6 may be a power amplification circuit.

For the first voltage conversion circuit, the voltage of the detection point corresponding to the first voltage conversion circuit may represent (or reflect) a voltage provided by the first voltage conversion circuit for the coupled electricity-consuming load.

For example, a detection point 2 corresponding to the voltage conversion circuit 2 may be set between the voltage conversion circuit 2 and the electricity-consuming load 2, and a voltage of the detection point 2 may represent (or reflect) a voltage output by the voltage conversion circuit 2, or a supply voltage provided by the voltage conversion circuit 2 for the electricity-consuming load. If the controller 21 determines that a real voltage of the detection point 2 is less than a voltage threshold 2 corresponding to the voltage conversion circuit 2, the voltage conversion circuit 2 may be faulty (may be abnormal), or the electricity-consuming load 2 is faulty. If the controller 21 determines that the real voltage of the detection point 2 is greater than or equal to the voltage threshold 2 corresponding to the voltage conversion circuit 2, a voltage provided by the voltage conversion circuit 2 for the electricity-consuming load 2 may meet a working voltage required for the electricity-consuming load 2. In some possible scenarios, the controller 21 may alternatively be used as the electricity-consuming load 2.

For another example, a detection point 3 corresponding to the voltage conversion circuit 3 may be set between the regulator 1 and the electricity-consuming load 3 that are coupled to the voltage conversion circuit 3. The regulator 1 usually has a voltage regulation function, and provides a stable voltage for the electricity-consuming load 3. A voltage of the detection point 3 may represent (or reflect) a voltage provided by the regulator 1 for the electricity-consuming load 3, or may represent a supply voltage output by the voltage conversion circuit 3 to the electricity-consuming load 3. If the controller 21 determines that the real voltage of the detection point 3 is less than a voltage threshold 3 corresponding to the electricity-consuming load 3, the regulator 1 may be faulty, or the voltage conversion circuit 3 may be faulty, or the electricity-consuming load 3 may be faulty. If the controller 21 determines that the real voltage of the detection point 3 is greater than or equal to the voltage threshold 3 corresponding to the electricity-consuming load 3, a voltage provided by the voltage conversion circuit 3 for the electricity-consuming load 3 may meet a working voltage required for the electricity-consuming load 3. In some possible scenarios, the electricity-consuming load 3 may be a clock circuit.

For another example, the voltage conversion circuit 4 may not only supply power to the electricity-consuming load 4, but also supply power to the electricity-consuming load 5. A voltage of the detection point may represent (or reflect) a voltage provided by the voltage conversion circuit 4 for the electricity-consuming load 4, or may reflect a voltage provided by the voltage conversion circuit 4 for the electricity-consuming load 5. The detection point 4 corresponding to the voltage conversion circuit 4 may be set between an output end of the voltage conversion circuit 4 and an input end of the regulator 2, and between an output end of the voltage conversion circuit 4 and an input end of the regulator 3. The electricity-consuming load 4 and the electricity-consuming load 5 each are coupled to the power supply through the voltage conversion circuit 4. If the voltage conversion circuit 4 is faulty, normal working of the electricity-consuming load 4 and the electricity-consuming load 5 may be affected. Therefore, the detection point 4 may be set, to detect whether the voltage conversion circuit 4 is faulty. If the controller 21 determines that a real voltage of the detection point 4 is less than a voltage threshold 4 corresponding to the electricity-consuming load 4, the voltage conversion circuit 4 may be faulty, or the regulator 2 is faulty, or the regulator 3 is faulty, or the electricity-consuming load 4 is faulty, or the electricity-consuming load 5 is faulty. If the controller 21 determines that the real voltage of the detection point 4 is greater than or equal to the voltage threshold corresponding to the electricity-consuming load 4, a voltage provided by the voltage conversion circuit 4 for each of the electricity-consuming load 4 and the electricity-consuming load 5 may meet a working voltage required for the electricity-consuming load 4 and a working voltage required for the electricity-consuming load 5. In some possible scenarios, the electricity-consuming load 4 may be a radio frequency transceiver. The electricity-consuming load 5 may be a load driven by a regulator.

It may be learned that the communication device provided in this example not only has high power supply voltage detection accuracy, but also can detect the voltage provided by the voltage conversion circuit in the communication device for the electricity-consuming load, to determine whether the voltage conversion circuit may supply power to the electricity-consuming load. In the plurality of Tx timeslots or the plurality of Rx timeslots of the communication device, the voltage sampling circuit 22 collects the voltage of the detection point corresponding to the voltage conversion circuit, so that a power supply status of the electricity-consuming load can be accurately determined. This facilitates timely maintenance of the communication device, for example, replacing a faulty voltage conversion circuit, a regulator, or an electricity-consuming load.

In the examples, the descriptions of the detection point corresponding to the voltage conversion circuit and the detection point corresponding to the power supply are merely used to describe a location and a function of the voltage collected by the voltage sampling circuit 22 in the communication device as examples. In an actual application scenario, the controller 21 may control the sampling circuit 22 to collect a voltage of a detection point corresponding to a key voltage conversion circuit, and determine a real voltage of the key voltage conversion circuit. The key voltage conversion circuit may be a voltage conversion circuit coupled to a plurality of regulators or a plurality of electricity-consuming loads. Alternatively, the key voltage conversion circuit may be a voltage conversion circuit corresponding to an important electricity-consuming load, and the important electricity-consuming load may be a radio frequency transceiver, a clock circuit, or the like.

Based on the communication device provided in any one of the foregoing embodiments or examples, as shown in FIG. 3, the communication device may further include a switching circuit 23. The switching circuit 23 may selectively connect the voltage sampling circuit 22 to the detection point corresponding to the power supply or the detection point corresponding to the first voltage conversion circuit. For example, under control of the controller 21, the switching circuit 23 may connect the to-be-detected point to the voltage sampling circuit 22. The voltage sampling circuit 22 may collect a voltage of the to-be-detected point. The to-be-detected point may be a detection point corresponding to any voltage conversion circuit in the communication device, or a detection point corresponding to the power supply.

In some examples, the switching circuit 23 may include a plurality of switches, the detection point corresponding to the first voltage conversion circuit may be coupled to the voltage sampling circuit 22 through one switch, and the detection point corresponding to the power supply may be coupled to the voltage sampling circuit 22 through one switch. If the switch between the detection point corresponding to the power supply and the voltage sampling circuit 22 is in an on state, the voltage sampling circuit 22 and the detection point corresponding to the power supply are connected. If the switch between the detection point corresponding to the power supply and the voltage sampling circuit 22 is in an off state, the voltage sampling circuit 22 and the detection point corresponding to the power supply are in a disconnected state. If the switch between the detection point corresponding to the first voltage conversion circuit and the voltage sampling circuit 22 is in an on state, the voltage sampling circuit 22 and the detection point corresponding to the first voltage conversion circuit are connected. If the switch between the detection point corresponding to the first voltage conversion circuit and the voltage sampling circuit 22 is in an off state, the voltage sampling circuit 22 and the detection point corresponding to the first voltage conversion circuit are in a disconnected state.

Figure 4:
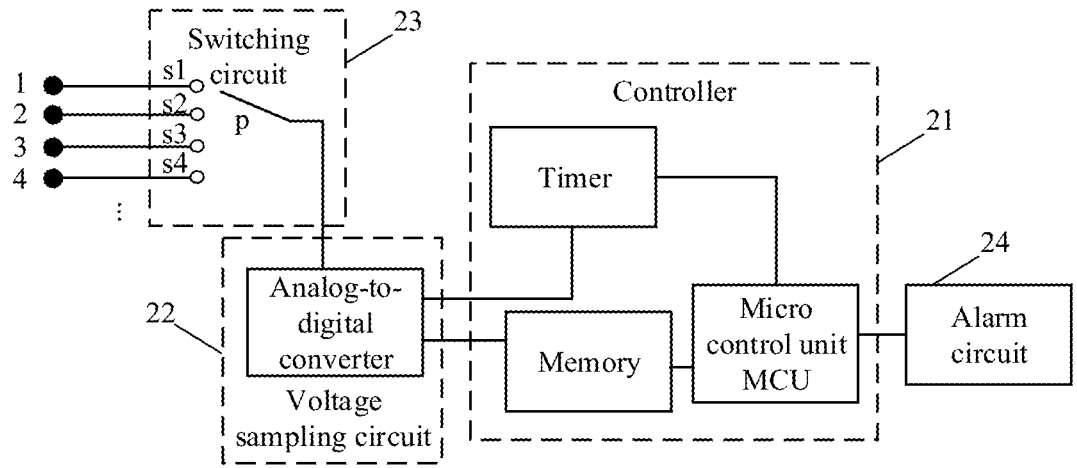
FIG. 4 is a schematic diagram of a structure of a communication device according to an example embodiment.

In some other examples, as shown in FIG. 4, the switching circuit 23 may include a single-pole multi-throw switch. A movable end p of the single-pole multi-throw switch is connected to the voltage sampling circuit 22, and different fixed ends of the single-pole, multi-throw switch are respectively connected to different detection points in the communication device. When the movable end p of the single-pole multi-throw switch is connected to a fixed end, a detection point coupled to the fixed end and the voltage sampling circuit 22 are connected. For example, a detection point coupled to a fixed end s1 is the detection point 1, and the detection point 1 is the detection point corresponding to the power supply. When the movable end p of the single-pole multi-throw switch and the fixed end s1 are connected, the detection point 1 and the voltage sampling circuit 22 are connected, and the voltage sampling circuit 22 may collect the voltage of the detection point 1. For another example, a detection point coupled to a fixed end s2 is the detection point 2, and the detection point 2 is the detection point corresponding to the voltage conversion circuit 2. When the movable end p of the single-pole multi-throw switch and the fixed end s2 are connected, the detection point 2 and the voltage sampling circuit 22 are connected, and the voltage sampling circuit 22 may collect the voltage of the detection point 2.

In an embodiment, as shown in FIG. 4, the voltage sampling circuit 22 may include an analog-to-digital converter (ADC). The ADC may collect an analog voltage, convert an analog voltage value into a digital voltage value, and output the digital voltage value to the controller 21. In some examples, the controller 21 may determine, based on a digital voltage value of the detection point corresponding to the power supply and the voltage threshold corresponding to the power supply, whether the electricity quantity of the power supply is sufficient. In some other examples, the controller 21 may further determine, based on a digital voltage value of the detection point corresponding to the voltage conversion circuit and the voltage threshold corresponding to the voltage conversion circuit, determine whether the electricity-consuming load coupled to the voltage conversion circuit may work.

Based on the communication device provided in any one of the foregoing embodiments or examples, as shown in FIG. 4, the controller 21 may include a memory and a micro control unit (MCU). The memory may store a voltage threshold corresponding to each detection point, for example, the voltage threshold corresponding to the power supply, a voltage threshold corresponding to each voltage conversion circuit, and a voltage transformation ratio parameter of each voltage conversion circuit. The memory may also store a digital voltage value of a detection point provided by the voltage sampling circuit 22 for the controller 21. The MCU may read, from the memory, data such as the digital voltage value of each detection point, the voltage threshold corresponding to the power supply, and a voltage threshold corresponding to an electricity-consuming load. Optionally, in some scenarios, the controller 21 may include a central processing unit (CPU) and the memory. The following uses an example in which the controller 21 includes the memory and the MCU for description. It should be understood that the CPU may perform an operation performed by the MCU in this embodiment of this application, that is, may have a capability of the MCU in this embodiment of this application.

The MCU may control the voltage sampling circuit 22, and may also control the voltage conversion circuit and the electricity-consuming load. In an embodiment, as shown in FIG. 4, the MCU may include a timer. The timer may be connected to the voltage sampling circuit 22. For example, the timer may be connected to the ADC. The timer may send a control level to the ADC in an Rx timeslot or a Tx timeslot of the communication device, to enable the ADC to collect the voltage of the to-be-detected point.

In some examples, in an Rx timeslot or a Tx timeslot, the timer may separately send a control level to the ADC at different moments, to enable the ADC to collect voltages of the to-be-detected point at the different moments. For example, in an Rx timeslot, the timer separately sends a control level to the ADC at a first moment, a second moment, and a third moment. A voltage of the to-be-detected point collected by the ADC at the first moment is denoted as Data1, a voltage of the to-be-detected point collected by the ADC at the second moment is denoted as Data2, and a voltage of the to-be-detected point collected by the ADC at the third moment is denoted as Data3. The to-be-detected point may be a detection point corresponding to the power supply, or may be a detection point corresponding to any voltage conversion circuit.

To obtain stable voltage data at the to-be-detected point, the MCU may determine a real voltage of the to-be-detected point based on voltages of the to-be-detected point at a plurality of moments. For example, an average value of the voltages of the to-be-detected point at a plurality of moments may be determined as the real voltage of the to-be-detected point.

Figure 5:
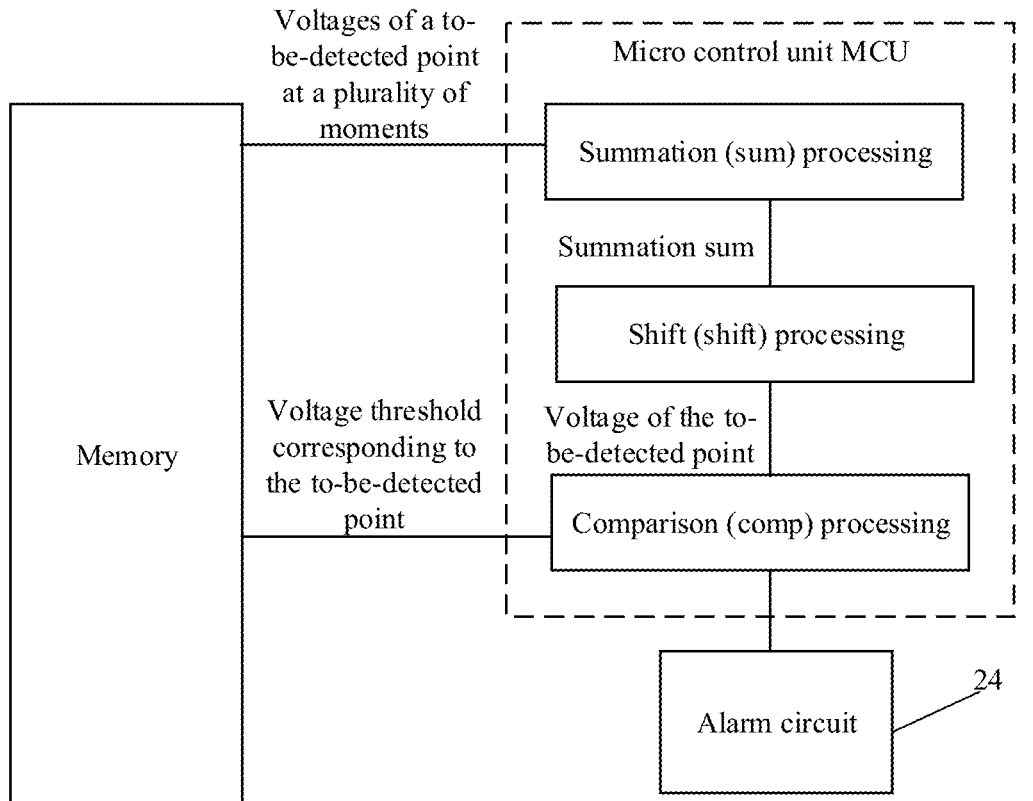
FIG. 5 is a schematic diagram of a processing process of a micro control unit according to an example embodiment.

In an embodiment, the memory may store data in a binary format, for example, store the voltage threshold corresponding to each detection point, for example, the voltage threshold corresponding to the power supply and the voltage threshold corresponding to the electricity-consuming load. As shown in FIG. 5, the MCU may have a data processing capability.

For example, the MCU may perform summation (sum) processing on data. The MCU may determine the real voltage of the to-be-detected point based on the voltages that are of the to-be-detected point at the plurality of moments and that are collected by the ADC. For example, the MCU may perform summation processing on the voltages of the to-be-detected points that are collected at the plurality of moments. For example, the MCU may obtain, from the memory, voltage values of the to-be-detected points that are collected at the plurality of moments, and perform summation processing. A summation result Datasum may also be stored in the memory in a binary format.

For another example, the MCU may perform shift (shift) processing on the data. The MCU may perform right-shift processing on the summation result Datasum. The summation result Datasum is a value obtained by performing summation processing, by the MCU, on k voltage values, where k is generally an even number. The MCU may right-shift a binary format of the summation result Datasum by k/2 bits. The MCU may obtain an average value of the k voltage values by performing shift processing on the summation result Datasum. The average value of the k voltage values may represent (or reflect) the real voltage of the to-be-detected point.

For example, the memory stores the voltage Data1 of the to-be-detected point that is collected by the ADC at the first moment and the voltage Data2 of the to-be-detected point that is collected by the ADC at the second moment. The MCU performs summation processing sum (Data1, Data2) on the Data1 and the Data2, and a summation result is denoted as Datasum1. The MCU may right-shift a binary format of the Datasum1 by 1 bit, and a value obtained through shift processing is an average value of the Data1 and the Data2.

For another example, the memory stores the voltage Data1 of the to-be-detected point that is collected by the ADC at the first moment, the voltage Data2 of the to-be-detected point that is collected by the ADC at the second moment, the voltage Data3 of the to-be-detected point that is collected by the ADC at the third moment, and the voltage Data4 of the to-be-detected point that is collected by the ADC at a fourth moment. The MCU performs summation processing sum (Data1, Data2, Data3, Data4) on the Data1, Data2, Data3, and Data4, and a summation result obtained through sum processing is denoted as Datasum2. The MCU may right-shift a binary format of Datasum1 by 2 bits, and a value obtained through shift processing is an average value of Data1 Data2, Data3, and Data4.

The MCU may compare a determined real voltage of the to-be-detected point with the voltage threshold corresponding to the to-be-detected point. As shown in FIG. 5, the MCU may obtain the voltage threshold corresponding to the to-be-detected point from the memory, and perform comparison (comp) processing on the determined voltage of the to-be-detected point, that is, compare (or determine) a magnitude of the voltage of the to-be-detected point and a magnitude of the voltage threshold corresponding to the to-be-detected point.

Based on the communication device provided in any one of the foregoing embodiments, in an embodiment, there may be one or more target electricity-consuming loads in the n electricity-consuming loads in the communication device. The target electricity-consuming load may exchange a signal with a base station or a server. For example, the target electricity-consuming load may include the power transmit circuit and/or radio frequency transceiver. The Tx timeslot of the communication device may be a timeslot in which the target load transmits a wireless communication signal. The Rx timeslot of the communication device may be a timeslot in which the target load receives a wireless communication signal.

The MCU may determine whether the determined real voltage of the to-be-detected point is less than the voltage threshold corresponding to the to-be-detected point. When determining that the determined real voltage of the to-be-detected point is less than the voltage threshold corresponding to the to-be-detected point, the MCU controls the target electricity-consuming load to reduce a transmit power at which the signal is sent. Alternatively, the MCU controls the target electricity-consuming load to send a wireless communication signal that carries a prompt message to the server (for example, the background) or the base station, where the prompt message may indicate that the communication device needs to be maintained, to notify the base station or the server to maintain the communication device, for example, maintain the power supply, the voltage conversion circuit, the regulator, or the electricity-consuming load.

Based on the communication device provided in any one of the foregoing embodiments or examples, still as shown in FIG. 3, the communication device may further include an alarm circuit 24. The alarm circuit 24 may be connected to the controller 21, for example, connected to the MCU in the controller 21. When the MCU determines that the determined real voltage of the to-be-detected point is less than the voltage threshold corresponding to the to-be-detected point, an alarm signal may be generated. The alarm signal may represent (or reflect) that the voltage of the to-be-detected point is low.

The alarm circuit 24 may perform alarm after receiving the alarm signal that represents that the voltage of the to-be-detected point is low and that is provided by the controller 21. For example, the alarm circuit 24 may include a light emitting diode (LED), a buzzer, or the like. After receiving the alarm signal, the alarm circuit 24 may drive the LED to blink, or drive the buzzer to make a sound, or the like. This is not limited in this application.

Based on the descriptions of the communication device provided in this application, this application further provides a voltage detection method, which may be applied to determining a real voltage of a power supply in the communication device. The communication device may be the communication device provided in any one of the foregoing embodiments. The method may be executed or implemented by the controller 21 or a control apparatus. As shown in FIG. 6, the voltage detection method may include the following operations:

Operation S101: The controller 21 controls the voltage sampling circuit 22 to collect voltages output by the power supply or voltages output by the first voltage conversion circuit of the communication device in the plurality of sending timeslots or the plurality of receiving timeslots of the communication device.

Operation S102: The controller 21 determines the real voltage of the power supply based on the voltages output by the power supply or the voltages output by the first voltage conversion circuit in the plurality of sending timeslots or the plurality of receiving timeslots of the communication device.

For example, the controller 21 may determine an average value of the voltages output by the power supply in the plurality of transmitting timeslots or the plurality of receiving timeslots as the real voltage of the power supply. Alternatively, the controller 21 may determine the real voltage of the power supply based on the voltage transformation ratio parameter of the first voltage conversion circuit and the average value of the voltages output by the first voltage conversion circuit in the plurality of transmitting timeslots or the plurality of receiving timeslots.

In an embodiment, each voltage conversion circuit is configured to: perform voltage transformation processing on a voltage provided by the power supply, and then provide a transformed voltage to at least one load; and one or more target loads exist in loads coupled to the one or more voltage conversion circuits and are configured to: transmit a wireless communication signal or receive a wireless communication signal.

The sending timeslot is a timeslot in which the target load transmits a wireless communication signal, and the receiving timeslot is a timeslot in which the target load receives a wireless communication signal.

After determining the real voltage of the power supply, the controller 21 may, when the real voltage of the power supply is less than the preset voltage threshold of the power supply, control the target load to transmit the wireless communication signal that carries the prompt message, where the prompt message indicates that the communication device needs to be maintained; and/or when the real voltage of the power supply is less than the voltage threshold of the power supply, reduce a transmit power at which the target load transmits a wireless communication signal, to avoid voltage jitter caused by excessively large transmit power.

In an embodiment, after controlling the voltage sampling circuit to collect the voltages output by the power supply or the voltages output by the first voltage conversion circuit of the communication device in the plurality of sending timeslots or the plurality of receiving timeslots of the communication device, the controller 21 determines the average value of the voltages output by the first voltage conversion circuit in the plurality of transmitting timeslots or the plurality of receiving timeslots as the real voltage output by the first voltage conversion circuit. When the real voltage of the first voltage conversion circuit is less than the preset voltage conversion circuit voltage threshold, the controller controls the target load to transmit the wireless communication signal that carries the prompt message, and the prompt message indicates that the communication device needs to be maintained.

In an embodiment, the communication device further includes the switching circuit 23. The switching circuit 23 is configured to selectively connect the voltage sampling circuit 22 to the power supply or the first voltage conversion circuit. Before controlling the voltage sampling circuit to collect the voltages output by the power supply or the first voltage conversion circuit in the plurality of sending timeslots or the plurality of receiving timeslots of the communication device, the controller 21 may further control the switching circuit to connect the voltage sampling circuit to the power supply or the first voltage conversion circuit.

After determining the real voltage of the power supply, the controller 21 may further determine whether the real voltage of the power supply is less than the voltage threshold corresponding to the power supply. When the real voltage of the power supply is less than the preset voltage threshold of the power supply, the controller 21 may control the alarm circuit 24 of the communication device to send an alarm signal, and the alarm signal is a visual signal or an audible signal.

All or some of the foregoing embodiments may be implemented by using software, hardware, firmware, or any combination thereof. When software is used to implement embodiments, all or a part of embodiments may be implemented in a form of a computer program product. The computer program product includes one or more computer instructions. When the computer program instructions are loaded and executed on a computer, all or some of the procedures or functions according to embodiments of this application are generated. The computer may be a general-purpose computer, a dedicated computer, a computer network, or other programmable apparatuses. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, like a server or a data center, integrating one or more usable media. The usable medium may be a magnetic medium (for example, a floppy disk, a hard disk, or a magnetic tape), a semiconductor medium (for example, a solid state disk (SSD)) or the like.

An embodiment of this application further provides a readable storage medium, configured to store the method or the algorithm provided in the foregoing embodiments, for example, a random access memory (RAM), a flash memory, a read-only memory (ROM), an EPROM (EPROM) memory, a non-volatile read-only memory, a register, a hard disk, a removable disk, or any other form of storage medium in the art.

Operations of the method or algorithm described in embodiments of this application may be directly embedded into the control apparatus or the controller 21. The control apparatus or the controller 21 may include a RAM memory, a flash memory, a ROM memory, an EPROM memory, a register, a hard disk, a removable disk, or any other form of storage medium in the art, and is configured to store the operations of the method or algorithm provided in embodiments of this application. For example, the storage medium may be connected to the MCU in the control apparatus or the controller 21, so that the MCU can read information from the storage medium and write information to the storage medium. Optionally, the storage medium may alternatively be integrated into the controller 21 or the control apparatus.

These computer program instructions may also be loaded onto a computer or another programmable data processing device, so that a series of operations and operations are performed on the computer or the another programmable device, to generate computer-implemented processing. Therefore, the instructions executed on the computer or the another programmable device provide operations for implementing a specific function in one or more processes in the flowcharts and/or in one or more blocks in the block diagrams.

Although this application is described with reference to specific features and embodiments thereof, it is clear that various modifications and combinations may be made to them without departing from the spirit and scope of this application. Correspondingly, the specification and accompanying drawings are merely example description of this application defined by the accompanying claims, and are considered as any of or all modifications, variations, combinations or equivalents that cover the scope of this application.

What is claimed is:

1. A communication device, comprising:
one or more voltage conversion circuits coupled to a power supply of the communication device, wherein each of the voltage conversion circuits is configured to:
perform voltage transformation processing on a voltage provided by the power supply and provide a transformed voltage to at least one load;
a voltage sampling circuit coupled to at least one of: the power supply or an output end of at least one of the voltage conversion circuits;
a controller coupled to the voltage sampling circuit and is configured to:
control a switching circuit to connect the voltage sampling circuit to the power supply or a first voltage conversion circuit of the voltage conversion circuits;
after the control of the switching circuit to connect the voltage sampling circuit to the power supply or the first voltage conversion circuit, control the voltage sampling circuit to collect voltages output by the power supply or by the first voltage conversion circuit in a plurality of sending timeslots or a plurality of receiving timeslots of the communication device; and
determine a real voltage of the power supply based on the voltages output by the power supply or by the first voltage conversion circuit in the plurality of sending timeslots or the plurality of receiving timeslots of the communication device; and
wherein the switching circuit is coupled to the voltage sampling circuit, the power supply, and each of the voltage conversion circuits, wherein the switching circuit is configured to selectively connect the voltage sampling circuit to the power supply or the first voltage conversion circuit.

2. The communication device according to claim 1, wherein when determining the real voltage of the power supply based on the voltages output by the power supply or by the first voltage conversion circuit in the plurality of sending timeslots or the plurality of receiving timeslots of the communication device, the controller is configured to:
determine an average value of the voltages output by the power supply in the plurality of sending timeslots or the plurality of receiving timeslots as the real voltage of the power supply; or
determine the real voltage of the power supply based on a voltage transformation ratio parameter of the first voltage conversion circuit and an average value of the voltages output by the first voltage conversion circuit in the plurality of sending timeslots or the plurality of receiving timeslots.

3. The communication device according to claim 1, wherein one or more target loads coupled to the one or more voltage conversion circuits are configured to transmit a wireless communication signal or receive a wireless communication signal.

4. The communication device according to claim 3, wherein a sending timeslot is a timeslot in which the target load transmits a wireless communication signal, and a receiving timeslot is a timeslot in which the target load receives a wireless communication signal.

5. The communication device according to claim 3, wherein the controller is further configured to:
when the real voltage of the power supply is less than a preset voltage threshold of the power supply, control the target load to transmit a wireless communication signal that carries a prompt message indicating that the communication device needs to be maintained; or
when the real voltage of the power supply is less than the voltage threshold of the power supply, reduce a transmit power at which the target load transmits a wireless communication signal.

6. The communication device according to claim 3, wherein the controller is further configured to:
determine an average value of the voltages output by the first voltage conversion circuit in the plurality of sending timeslots or the plurality of receiving timeslots as a real voltage output by the first voltage conversion circuit; and
when the real voltage of the first voltage conversion circuit is less than a preset voltage conversion circuit voltage threshold, control the target load to transmit a wireless communication signal that carries a prompt message, wherein the prompt message indicates that the communication device needs to be maintained.

7. The communication device according to claim 1, further comprising an alarm circuit coupled to the controller, wherein the controller is further configured to:
when the real voltage of the power supply is less than a preset voltage threshold of the power supply, control the alarm circuit to send an alarm signal, wherein the alarm signal is a visual signal or an audible signal.

8. The communication device according to claim 1, wherein the communication device is a narrow band Internet of Things (IoT) device.

9. A voltage detection method, comprising:
controlling a voltage sampling circuit to collect voltages output by a power supply or by a first voltage conversion circuit of a communication device in a plurality of sending timeslots or a plurality of receiving timeslots of the communication device, wherein the communication device comprises one or more voltage conversion circuits coupled to the power supply of the communication device, and the voltage sampling circuit is coupled to at least one of: the power supply or an output end of at least one of the one or more voltage conversion circuits;
determining a real voltage of the power supply based on the voltages output by the power supply or by the first voltage conversion circuit in the plurality of sending timeslots or the plurality of receiving timeslots of the communication device; and
before controlling the voltage sampling circuit to collect the voltages output by the power supply or the first voltage conversion circuit in the plurality of sending timeslots or the plurality of receiving timeslots of the communication device, controlling a switching circuit to connect the voltage sampling circuit to the power supply or the first voltage conversion circuit, wherein the switching circuit is configured to selectively connect the voltage sampling circuit to the power supply or the first voltage conversion circuit.

10. The method according to claim 9, wherein determining a real voltage of the power supply based on the voltages output by the power supply or by the first voltage conversion circuit comprises:

determining an average value of the voltages output by the power supply in the plurality of sending timeslots or the plurality of receiving timeslots as the real voltage of the power supply; or determining the real voltage of the power supply based on a voltage transformation ratio parameter of the first voltage conversion circuit and an average value of the voltages output by the first voltage conversion circuit in the plurality of sending timeslots or the plurality of receiving timeslots.

11. The method according to claim 9, wherein each of the voltage conversion circuits is configured to:

perform voltage transformation processing on a voltage provided by the power supply, and provide a transformed voltage to at least one load, wherein one or more target loads coupled to the one or more voltage conversion circuits are configured to transmit a wireless communication signal or receive a wireless communication signal.

12. The method according to claim 11, wherein a sending timeslot is a timeslot in which the target load transmits a wireless communication signal, and a receiving timeslot is a timeslot in which the target load receives a wireless communication signal.

13. The method according to claim 11, wherein after determining the real voltage of the power supply, the method further comprises:

when the real voltage of the power supply is less than a preset voltage threshold of the power supply, controlling the target load to transmit a wireless communication signal that carries a prompt message indicating that the communication device needs to be maintained; or when the real voltage of the power supply is less than the voltage threshold of the power supply, reducing a transmit power at which the target load transmits a wireless communication signal.

14. The method according to claim 11, wherein after controlling a voltage sampling circuit to collect voltages output by a power supply or voltages output by a first voltage conversion circuit of the communication device, the method further comprises:

determining an average value of the voltages output by the first voltage conversion circuit in the plurality of sending timeslots or the plurality of receiving timeslots as a real voltage output by the first voltage conversion circuit; and when the real voltage of the first voltage conversion circuit is less than a preset voltage conversion circuit voltage threshold, controlling the target load to transmit a wireless communication signal that carries a prompt message indicating that the communication device needs to be maintained.

15. The method according to claim 9, wherein after determining a real voltage of the power supply, the method further comprises:

when the real voltage of the power supply is less than a preset voltage threshold of the power supply, controlling an alarm circuit of the communication device to send an alarm signal, wherein the alarm signal is a visual signal or an audible signal.

16. The method according to claim 9, wherein the communication device is a narrow band Internet of Things (IoT) device.

17. A non-transitory computer-readable storage medium storing a computer program or instructions, which when executed by a processor, cause the processor to perform a method, the method comprising:

controlling a voltage sampling circuit to collect voltages output by a power supply or by a first voltage conversion circuit of a communication device in a plurality of sending timeslots or a plurality of receiving timeslots of the communication device, wherein the communication device comprises one or more voltage conversion circuits coupled to the power supply of the communication device, and the voltage sampling circuit is coupled to at least one of: the power supply or an output end of at least one of the one or more voltage conversion circuits;

determining a real voltage of the power supply based on the voltages output by the power supply or by the first voltage conversion circuit in the plurality of sending timeslots or the plurality of receiving timeslots of the communication device; and before controlling the voltage sampling circuit to collect the voltages output by the power supply or the first voltage conversion circuit in the plurality of sending timeslots or the plurality of receiving timeslots of the communication device, controlling a switching circuit to connect the voltage sampling circuit to the power supply or the first voltage conversion circuit, wherein the switching circuit is configured to selectively connect the voltage sampling circuit to the power supply or the first voltage conversion circuit.

\* \* \* \* \*